United States Patent
Kobayashi et al.

(10) Patent No.: US 9,293,300 B2
(45) Date of Patent: Mar. 22, 2016

(54) PLASMA PROCESSING APPARATUS

(71) Applicant: Hitachi, Ltd., Chiyoda-ku, Tokyo (JP)

(72) Inventors: Hiroyuki Kobayashi, Kodaira (JP);
Hideyuki Nagaishi, Hachioji (JP);
Takumi Tandou, Hachioji (JP); Naoshi Itabashi, Hachioji (JP)

(73) Assignee: HITACHI, LTD., Tokyo (JP)

( * ) Notice: Subject to any disclaimer, the term of this patent is extended or adjusted under 35 U.S.C. 154(b) by 561 days.

(21) Appl. No.: 13/654,572

(22) Filed: Oct. 18, 2012

(65) Prior Publication Data

US 2013/0098556 A1    Apr. 25, 2013

(30) Foreign Application Priority Data

Oct. 20, 2011    (JP) .................................. 2011-230222

(51) Int. Cl.
*H01L 21/306*    (2006.01)
*C23F 1/00*    (2006.01)
*H01J 37/32*    (2006.01)
*B08B 7/00*    (2006.01)

(52) U.S. Cl.
CPC ......... *H01J 37/32174* (2013.01); *B08B 7/0035* (2013.01); *H01J 37/32082* (2013.01); *H01J 37/32155* (2013.01); *H01J 37/32366* (2013.01); *H01J 37/32376* (2013.01); *H01J 37/32532* (2013.01); *H01J 37/32541* (2013.01); *H01J 37/32577* (2013.01); *H01J 37/32899* (2013.01); *H01J 2237/335* (2013.01)

(58) Field of Classification Search
CPC .............. H01J 37/32174; H01J 37/32155; H01J 37/32577; H01J 37/32532; H01J 37/32082

USPC .................................................. 156/345.44
See application file for complete search history.

(56) References Cited

U.S. PATENT DOCUMENTS

| | | | | |
|---|---|---|---|---|
| 4,262,631 | A * | 4/1981 | Kubacki ................ | 118/723 MP |
| 7,533,629 | B2 * | 5/2009 | DeVries et al. ........... | 118/723 E |
| 7,540,257 | B2 * | 6/2009 | Kishimoto et al. ....... | 118/723 E |
| 2002/0076363 | A1 * | 6/2002 | Nelson et al. ............. | 422/174 |
| 2004/0018127 | A1 * | 1/2004 | Long et al. ............... | 422/186.04 |
| 2005/0011452 | A1 * | 1/2005 | Hayami et al. ........... | 118/723 E |

(Continued)

FOREIGN PATENT DOCUMENTS

| | | | | |
|---|---|---|---|---|
| JP | 2005/135892 | | 5/2005 | |
| JP | 2006-331664 | * | 12/2006 | ............... H05H 1/24 |

(Continued)

OTHER PUBLICATIONS

English translation JP 2006-331664, Yoshimoto, 12-1006.*

(Continued)

*Primary Examiner* — Keath Chen
(74) *Attorney, Agent, or Firm* — Baker Botts L.L.P.

(57) ABSTRACT

There is provided a plasma processing apparatus that can generate uniform plasma without increasing costs per unit electric power even though the discharge area is increased to adapt to samples in given sizes by arranging a plurality of plasma discharge units. A plasma processing apparatus includes an RF power supply having an RF signal circuit and an RF power circuit, a case, and a discharge electrode. A plasma module is configured of the discharge electrode and the RF power circuit provided in the case. A frequency signal from the RF signal circuit is inputted to a plurality of the plasma modules connected in parallel with each other.

14 Claims, 22 Drawing Sheets

(56) References Cited

U.S. PATENT DOCUMENTS

| | | | |
|---|---|---|---|
| 2006/0057854 A1* | 3/2006 | Setsuhara et al. | 438/710 |
| 2007/0123041 A1* | 5/2007 | Anzai et al. | 438/680 |
| 2009/0246942 A1 | 10/2009 | Imaeda et al. | |

FOREIGN PATENT DOCUMENTS

| | | |
|---|---|---|
| JP | 2008-186832 | 8/2008 |
| JP | 2009-263778 A | 11/2009 |
| JP | 2011-192532 A | 9/2011 |
| WO | WO 2011/114793 A1 | 9/2011 |
| WO | WO 2011/114840 A1 | 9/2011 |

OTHER PUBLICATIONS

JP Office Action mailed Jan. 27, 2015 in JP Patent Application No. 2011-230222.

* cited by examiner

FIG. 5
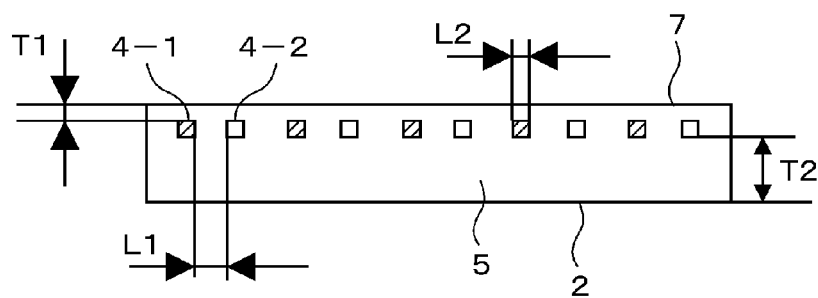
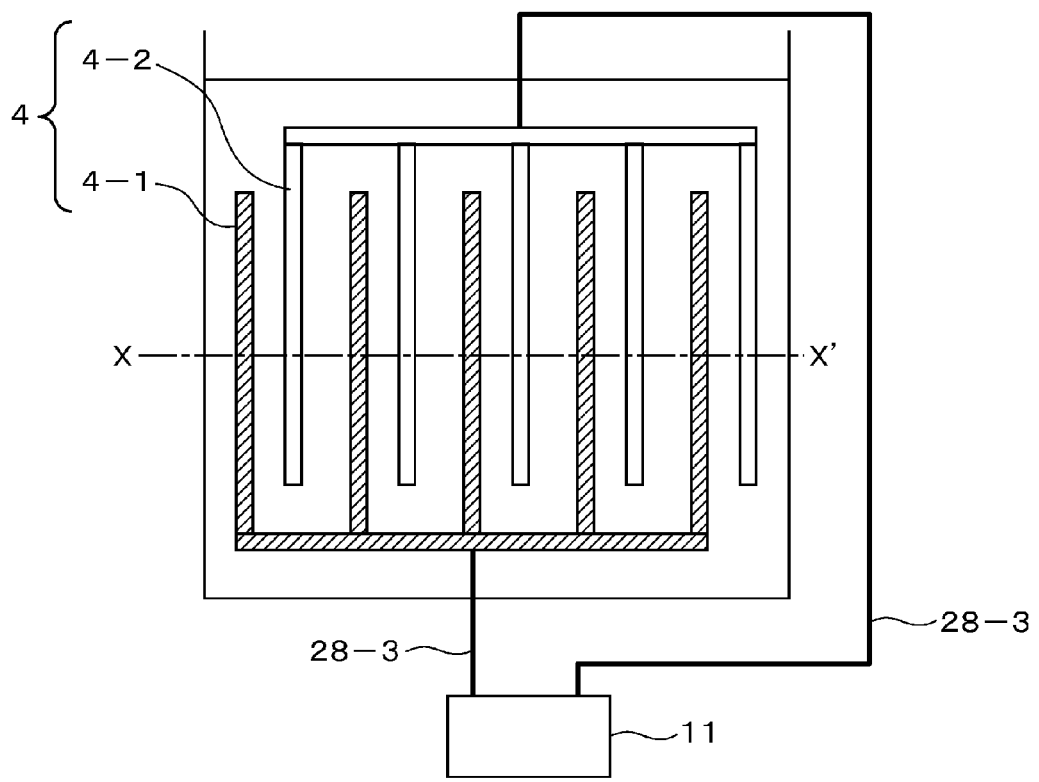

FIG. 8
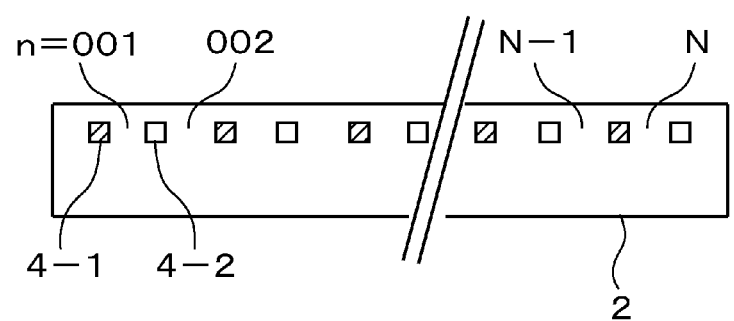
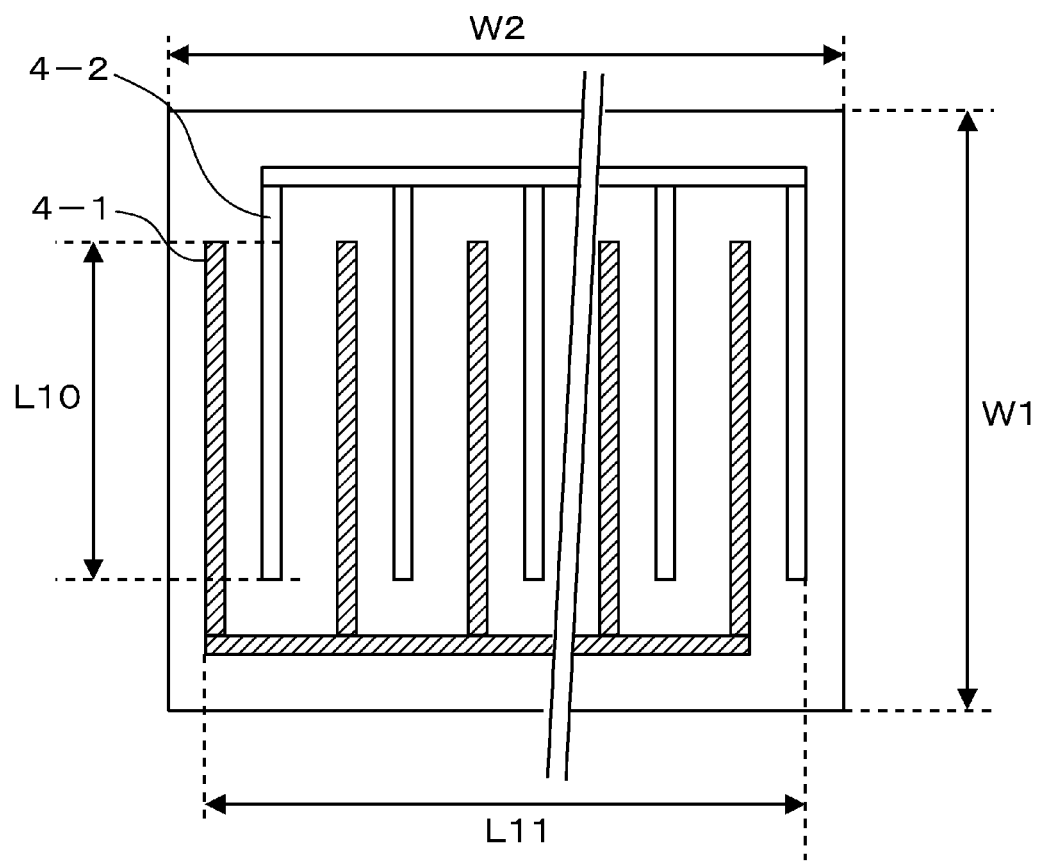

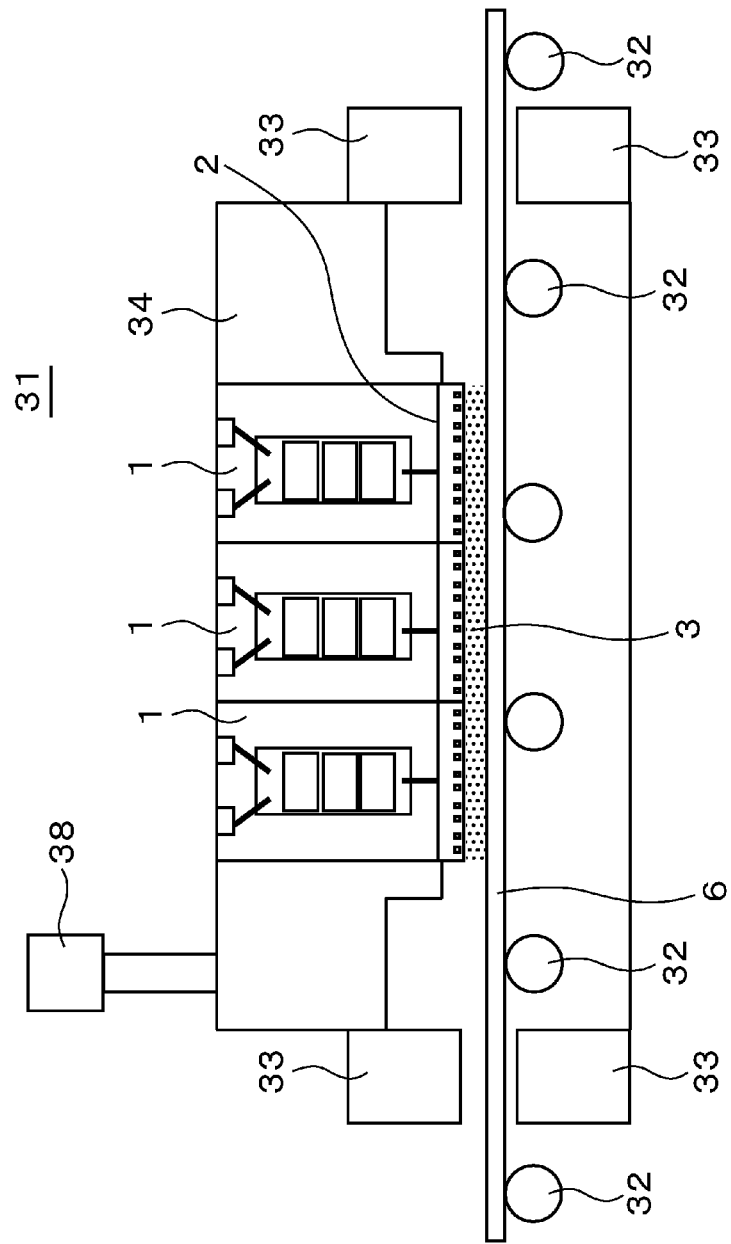

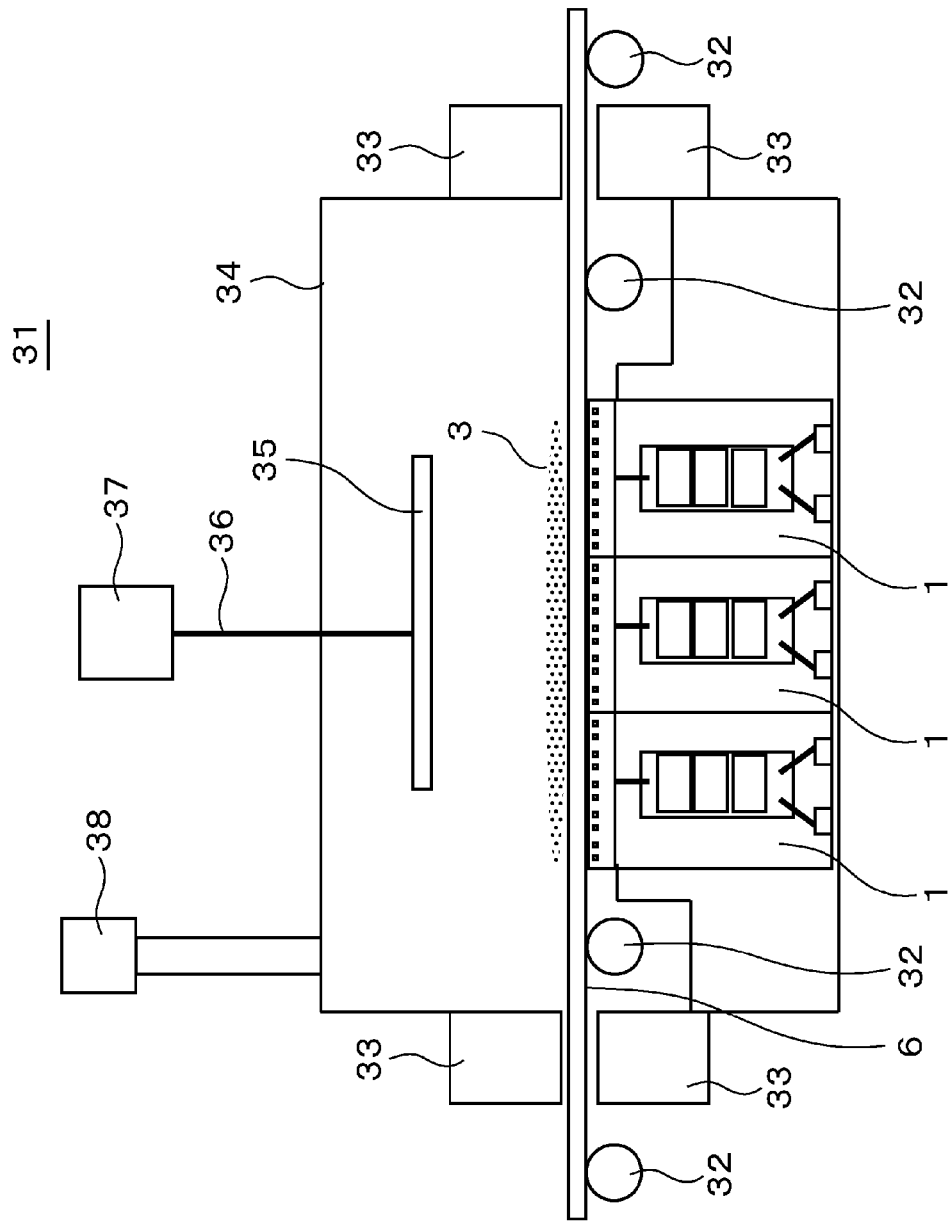

FIG.13
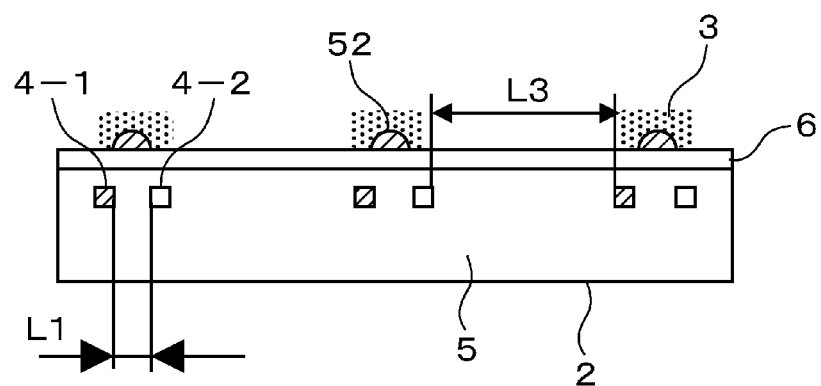
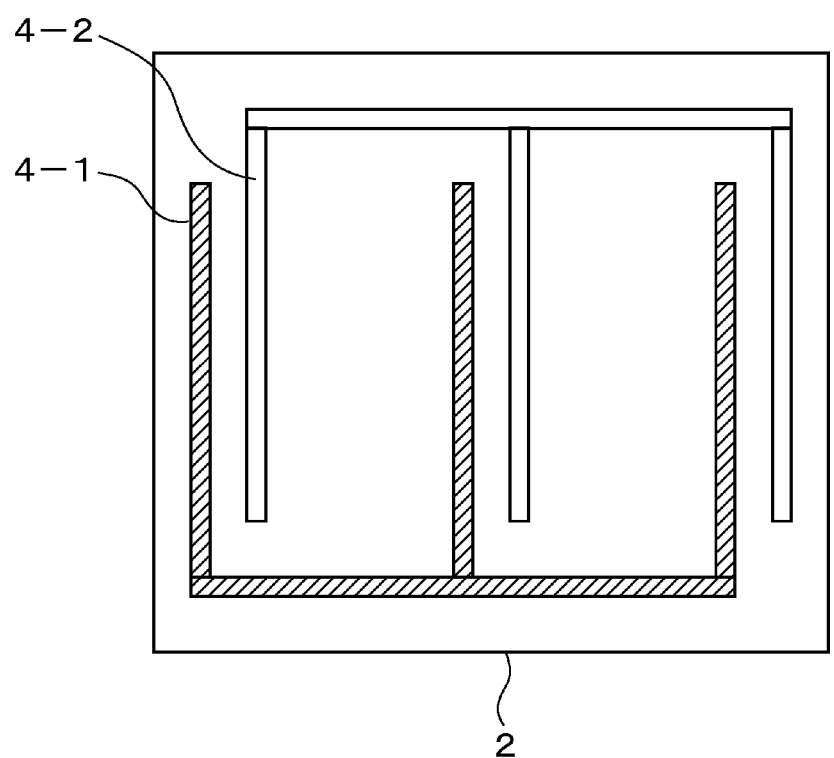

US 9,293,300 B2

PLASMA PROCESSING APPARATUS

CLAIM OF PRIORITY

The present application claims priority from Japanese Patent Application JP 2011-230222 filed on Oct. 20, 2011, the content of which is hereby incorporated by reference into this application.

BACKGROUND OF THE INVENTION

1. Field of the Invention

The present invention relates to a plasma processing apparatus for use in processing such as film deposition, surface modification, and cleaning using plasma.

2. Description of the Related Art

In recent years, with the advancement of studies on the techniques of generating plasma at an atmospheric pressure, methods that use plasma for forming a functional film such as DLC (Diamond-Like Carbon), for removing organic substances on material surfaces, for sterilization, or the like have been widely studied. For example, US Patent Application Publication No. US2007/0123041A1 describes a structure in which a plurality of discharge electrode plates are arranged in parallel with each other on a plasma processing apparatus that can flexibly adapt to the sizes of substrates. Moreover, Japanese Patent Application Laid-Open Publication No. 2008-186832 describes a plasma processing apparatus in a structure in which two types of electrodes are faced in a comb shape.

SUMMARY OF THE INVENTION

The inventors have studied a problem in the case where the discharge area is increased to adapt to samples (bodies to be processed) in given sizes by arranging a plurality of plasma discharge units. As a result, in increasing the area by arranging the plasma discharge units, in the case of a method where electric power is distributed from a single discharge RF (Radio Frequency) power supply, it has been found that power supply costs per unit electric power are increased when an output voltage exceeds a few watts, for example, and there are merits that power supply costs can be reduced in the case of using a plurality of power supplies with a relatively small output. On the other hand, it has been found that such problems arise when using a plurality of power supplies in that it is likely to cause faulty discharge due to phase differences between the power supplies and it is likely to cause fluctuations in the plasma density between the discharge units and fluctuations in electron temperature.

It is an object of the present invention to provide a plasma processing apparatus that can generate uniform plasma without increasing costs per unit electric power even in the case where the discharge area is increased to adapt to samples (bodies to be processed) in given sizes by arranging a plurality of plasma discharge units.

The following is representative aspects according to the present invention. Namely, a plasma processing apparatus includes a case, a discharge electrode provided in the case, and an RF power supply configured to generate plasma. The RF power supply includes: an RF signal circuit configured to determine a frequency; a low-voltage RF power circuit electrically connected to the RF signal circuit and configured to generate low-voltage RF power; and a booster circuit electrically connected to the low-voltage RF power circuit and configured to generate high-voltage RF power. An RF power circuit including at least the low-voltage RF power circuit and the booster circuit is provided in the case in which the discharge electrode is provided, and configures a plasma module. A plurality of the plasma modules are connected in parallel with each other, and the plasma modules are individually configured of the discharge electrode, the RF power circuit, and the case. The RF signal circuit is disposed independently from the plurality of the plasma modules. A frequency signal from the RF signal circuit is inputted to one of the plurality of the plasma modules, and transmitted between the plurality of the plasma modules in parallel.

Moreover, a plasma processing apparatus includes a plurality of plasma modules disposed adjacent to each other, and a control unit electrically connected to the plurality of plasma modules. The plasma modules individually include a discharge electrode and an RF power circuit electrically connected to the discharge electrode and configured to generate plasma. The discharge electrodes of the plasma modules are connected to the RF power circuits of the plasma modules using wires adjusted to have an equal length.

According to an aspect of the present invention, it is possible to provide a plasma processing apparatus that can generate uniform plasma without increasing costs per unit electric power even in the case where the discharge area is increased to adapt to samples (bodies to be processed) in given sizes by arranging a plurality of plasma discharge units.

BRIEF DESCRIPTION OF THE DRAWINGS

FIG. 5 is a schematic diagram of the configuration of a discharge electrode for generating plasma in the plasma processing apparatus according to the first embodiment of the present invention; the lower part is a top view and the upper part is an X-X' cross sectional view of the top view;

FIG. 8 is a diagram illustrative of various dimensions of the discharge electrode of the plasma processing apparatus according to the first embodiment of the present invention;

FIG. 9 is a schematic block diagram of an overall plasma processing apparatus (a plasma cleaning apparatus) according to the first embodiment of the present invention;

FIG. 10 is a schematic block diagram of an overall plasma processing apparatus (a plasma film deposition apparatus) according to a second embodiment of the present invention;

FIG. 13 is a diagram illustrative of partial film deposition using a different electrode pattern in the configuration of a discharge electrode of the plasma processing apparatus (the plasma film deposition apparatus) according to the second embodiment of the present invention; an upper diagram is a cross sectional view and a lower diagram is a top view;

DETAILED DESCRIPTION OF THE PREFERRED EMBODIMENTS

In the present invention, a single plasma module is configured of a combination of a discharge electrode, a case that fixes the discharge electrode, and an RF power circuit having a booster circuit and a matching circuit and provided in the case for generating plasma. The plasma module is configured in which a plurality of the plasma modules can be connected to each other and RF signals outputted from a control unit independently formed of the plasma modules are supplied to the plasma modules. Accordingly, it is possible to easily increase the discharge area of a plasma source at low costs, and it is possible to perform uniform processing to bodies to be processed in given sizes.

In the following, embodiments to which the present invention is specifically applied will be described in detail with reference to the drawings.

First Embodiment

A first embodiment will be described with reference to FIGS. 1 to 9.

Figure 1:
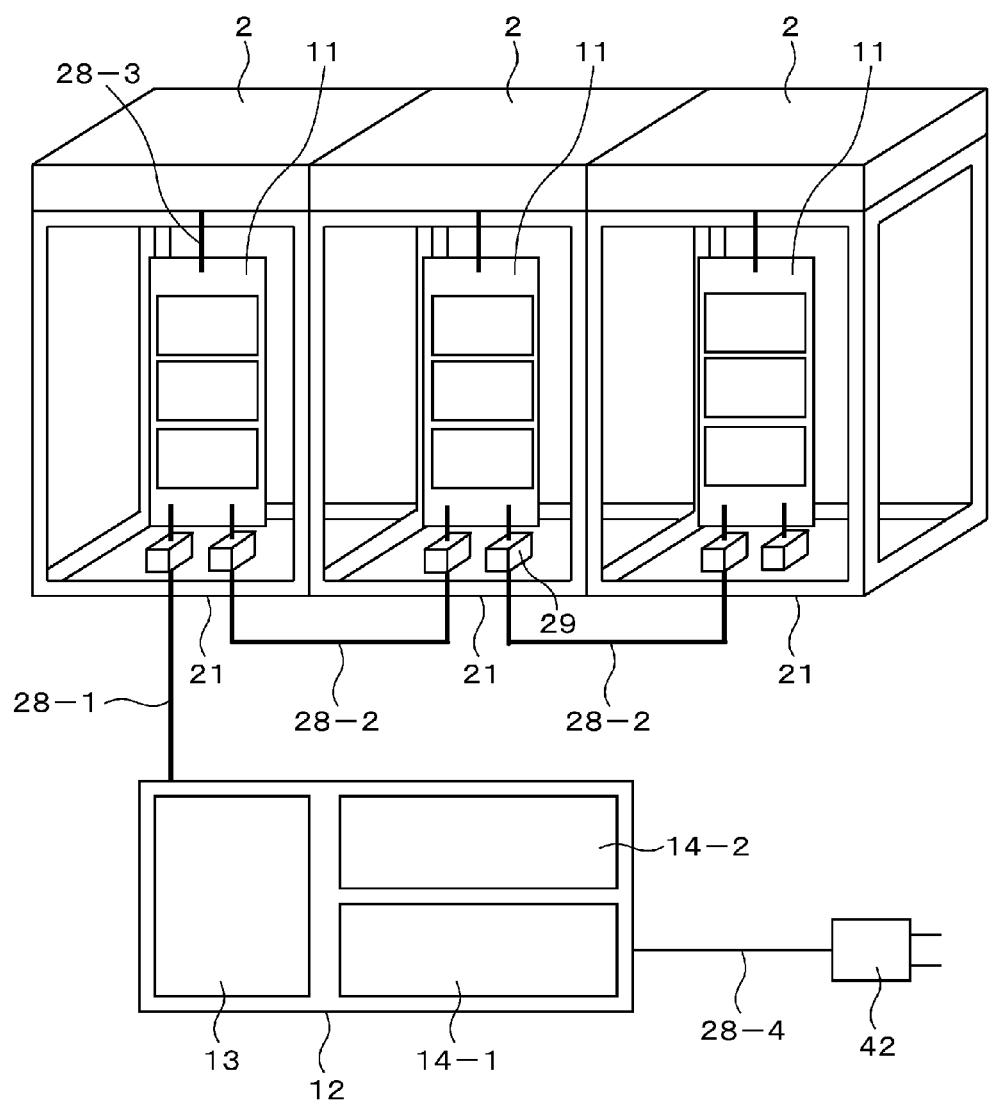
FIG. 1 is a schematic block diagram of the main part of a plasma processing apparatus according to a first embodiment of the present invention.
Figure 2:
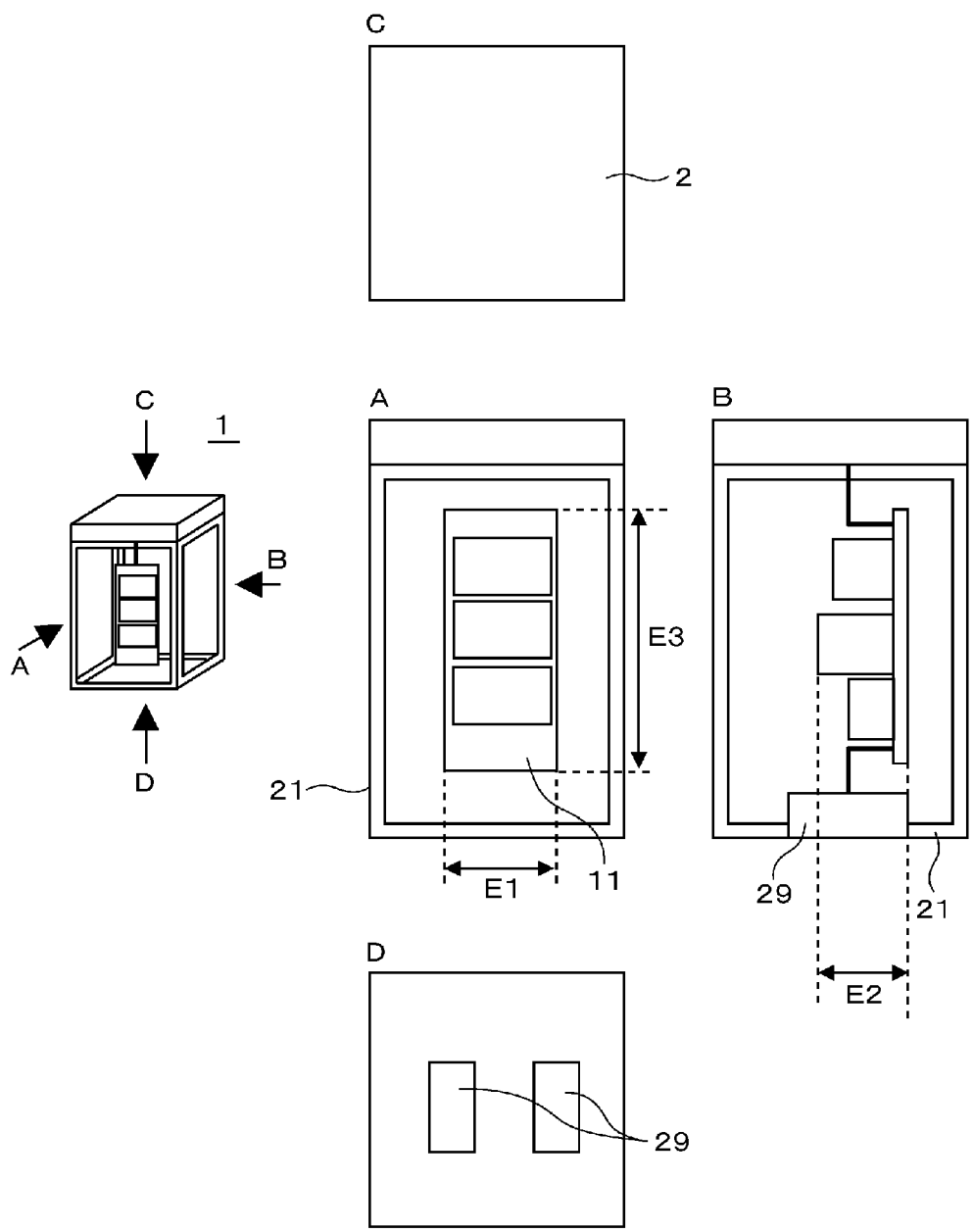
FIG. 2 is a detailed illustration of a plasma module according to the first embodiment of the present invention; the left part is a perspective view of the plasma module, the center part is a front view (a perspective view seen from an A direction), the right part is a right side view (a perspective view seen from a B direction), the upper part is a top view (a perspective view seen from a C direction), and the lower part is a bottom view (a perspective view seen from a D direction)
Figure 3:
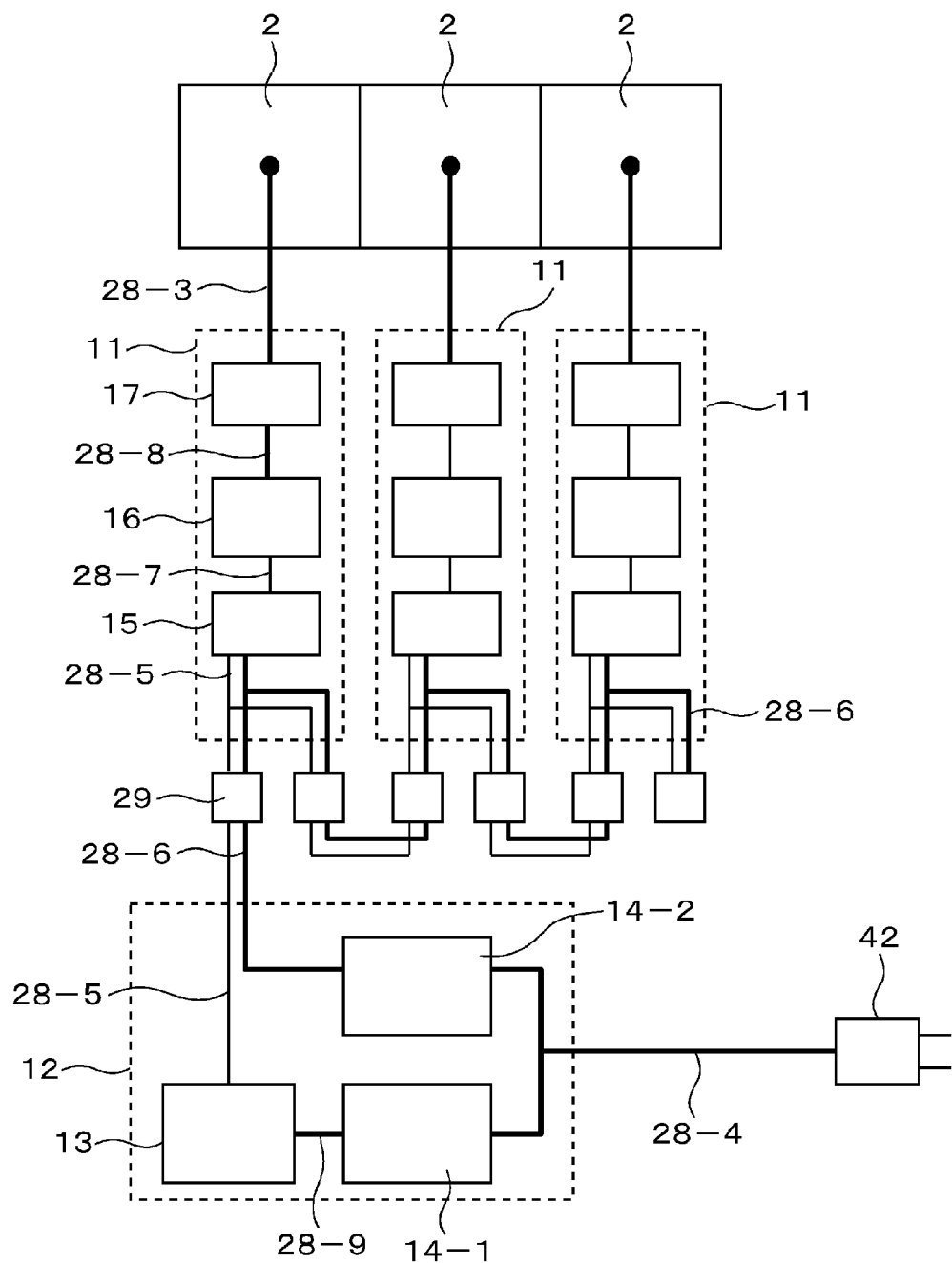
FIG. 3 is a schematic diagram of wiring connections between various circuits of the plasma processing apparatus according to the first embodiment of the present invention.
Figure 4:
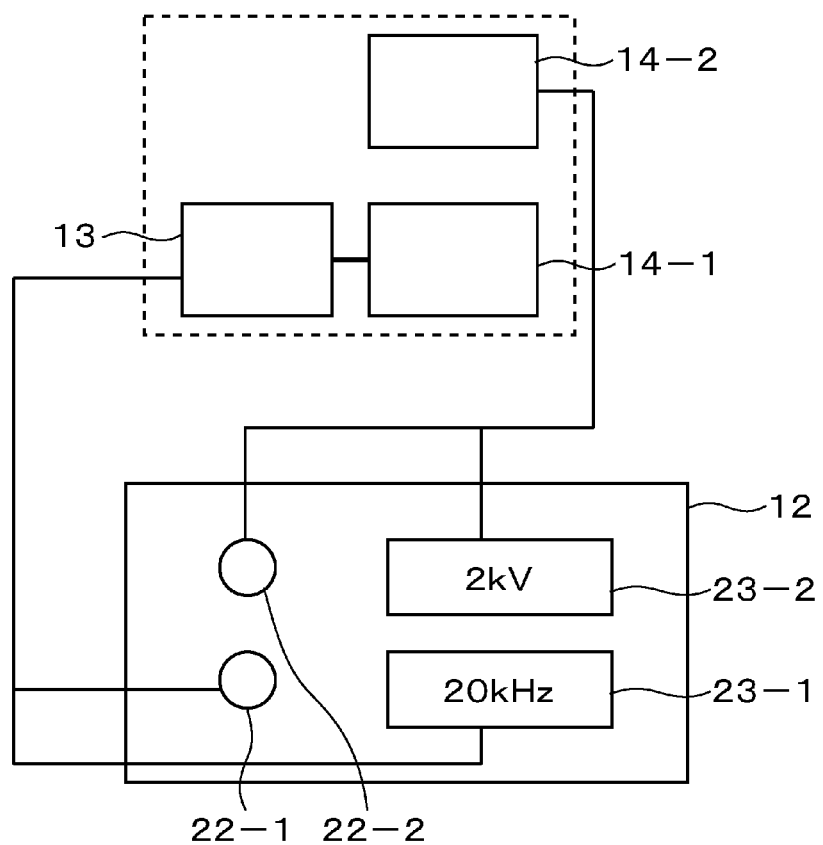
FIG. 4 is a schematic diagram of the configuration of a control unit of the plasma processing apparatus according to the first embodiment of the present invention.

FIG. 1 is a schematic block diagram of the main part of a plasma processing apparatus according to the embodiment, showing the configuration of a plasma module array. In the embodiment, three plasma modules are arranged in the lateral direction. FIG. 2 is a diagram of the configuration of a single plasma module in more detail. FIG. 3 is the outline of wiring connections between various circuits of the plasma processing apparatus including the plasma modules. FIG. 4 is a schematic diagram of the configuration of a control unit of the plasma processing apparatus.

As illustrated in FIG. 2, a plasma module 1 has the basic configuration of a case 21, an RF power circuit 11 accommodated in the case, and a discharge electrode 2 mounted on the upper part of the case 21. It is noted that a reference numeral 29 denotes a connector, and reference numerals E1, E2, and E3 denote the width, height, and length of the RF power circuit 11, respectively.

Moreover, as illustrated in FIG. 1, the plasma modules 1 can be connected in parallel with each other using a wire 28-2 through the connector 29 provided on the lower part of the case 21. Furthermore, a first module (at the left end in FIG. 1) is connected to a control unit 12 through a wire 28-1. It is noted that a reference numeral 13 denotes an RF signal circuit, reference numerals 14-1 and 14-2 denote DC power supplies, reference numerals 28-3 and 28-4 denote wires, and a reference numeral 42 denotes a plug. In addition, the same reference numerals denote the same components.

Air can flow through the side surfaces of the case 21 of the plasma module in order to cool the RF power circuit in which the case 21 is not covered as much as possible other than frames of the corner parts. Moreover, the side surfaces can be covered with a sheet of air permeable punched metal or the like, for example. Two connectors 29 are provided on the lower part of the case 21 (see D in FIG. 2). The connectors 29 are used for connecting the control unit 12, or connecting the plasma modules 1 to each other.

As illustrated in FIG. 3, the control unit 12 is configured of the RF signal circuit 13 and two DC power supplies 14-1 and 14-2. The DC power supply 14-1 is used for driving the RF signal circuit 13, and connected to the RF signal circuit 13 through a wire 28-9. Moreover, the DC power supply 14-2 is used for supplying electric power to the RF power circuit 11, and connected to the connector of the first module through a wire 28-6.

Next, the flow of electric power and electric signals will be described with reference to FIG. 3. Commercial 100-V AC power is used for source power in the embodiment. AC power obtained from a wall socket (the plug 42) through the wire 28-4 is converted into DC power at the DC power supplies 14-1 and 14-2. The DC power generated at the DC power supply 14-1 is transmitted to the RF signal circuit 13, and RF signals are generated here. The generated RF signals are transmitted to a low-voltage RF power circuit 15 in the RF power circuit 11 of each of the plasma modules 1 through a wire 28-5 and the connector 29. Moreover, the DC power generated at the DC power supply 14-2 is inputted to the low-voltage RF power circuit 15 of each of the plasma modules 1 through the wire 28-6 and the connector 29.

The low-voltage RF power circuit 15 converts the DC power supplied from the DC power supply 14-2 into low-voltage RF power based on the RF signals. The low-voltage RF power is inputted to the booster circuit 16 through a wire 28-7, and converted into high-voltage RF power (in the following, referred to as RF power) at the booster circuit 16. The RF power is inputted to the matching circuit 17 through a wire 28-8. Subsequently, the RF power is supplied to the discharge electrode 2 through the matching circuit 17, and plasma is generated at the discharge electrode 2.

When the length of the wire 28-3 connecting the RF power circuit 11 to the discharge electrode 2 is varied between the plasma modules 1, the wire capacity is not constant between the modules 1. In this case, since electric power inputted to plasma is varied between the plasma modules 1, it is necessary to make the length of the wire 28-3 equal between all the plasma modules 1 as much as possible in order to perform uniform plasma processing.

The control unit 12 has a function that can adjust at least the frequency and voltage of RF power. As illustrated in FIG. 4, the control unit 12 is provided with dial switches 22-1 and 22-2 that set the frequency and voltage of RF power and display units 23-1 and 23-2 that display the frequency and voltage of RF power. The frequency of RF power can be adjusted by changing the frequency of the RF signal in the RF signal circuit 13 using the dial switch 22-1. Moreover, the output voltage of RF power can be changed by adjusting the voltage of DC power generated at the DC power supply 14-2 using the dial switch 22-2. Namely, such a circuit configuration is formed in which the voltage value of low-voltage RF power generated at the low-voltage RF power circuit 15 is determined according to the DC voltage generated at the DC power supply 14-2, and the voltage of high-voltage RF power generated at the booster circuit 16 is determined according to the voltage value of low-voltage RF power. Of course, the detailed methods for generating RF power may be other methods as long as the basic configuration illustrated in FIG. 1 is satisfied.

Next, the configuration of the discharge electrode 2 will be described with reference to FIG. 5. The discharge electrode 2 has a structure in which an electrode 4 is provided in a dielectric layer 5. The electrode 4 is formed of two comb electrodes 4-1 and 4-2, in a structure in which the electrodes 4-1 and 4-2 are alternately disposed on each other when seeing the cross section of the discharge electrode. In the electrode 4, one of the electrodes 4-1 and 4-2 is used for an antenna, and the other is used for a ground, for example. Of course, such a method may be possible in which RF power "+V" and RF power "−V" in anti-phases are applied to the electrodes 4-1 and 4-2, respectively. Namely, the discharge electrode 2 is a surface discharge electrode based on dielectric barrier discharge. The electrode 4 is connected to the RF power circuit 11 through the wire 28-3. It is noted that a reference numeral 7 denotes a discharge surface, a reference numeral L1 denotes an electrode spacing (a gap), a reference numeral L2 denotes the width of the electrode, a reference numeral T1 denotes the thickness of the dielectric layer 5 above the electrode 4, and a reference numeral T2 denotes the thickness of the dielectric layer 5 below the electrode 4.

Figure 6:
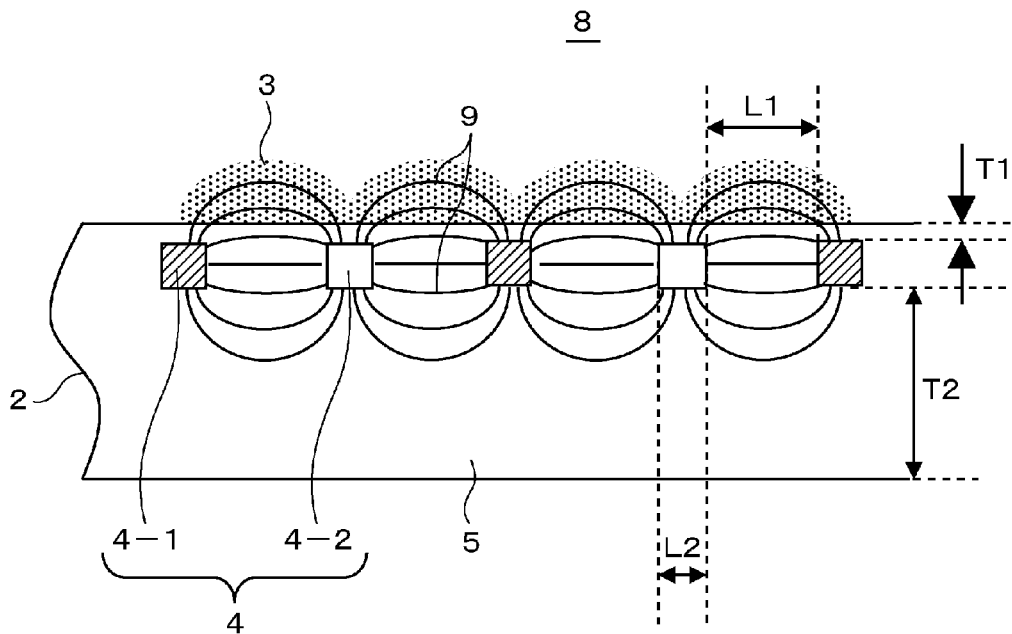
FIG. 6 is a schematic diagram illustrative of the principle of plasma discharge in the discharge electrode of the plasma processing apparatus according to the first embodiment of the present invention.

FIG. 6 is a diagram of an enlarged cross section of the discharge electrode 2. Among power lines 9 connecting the electrode 4-1 to the electrode 4-2, the power lines 9 going on a gaseous phase side 8 above the dielectric layer 5 contribute to generating plasma 3. Therefore, the surface thickness T1 of the dielectric layer 5 may be smaller than the electrode spacing L1 as much as possible in the range in which problems such as dielectric breakdown and damage caused by using up do not occur. Moreover, the thickness T2 of the dielectric layer 5 below the electrode 4 is made sufficiently greater than the thickness T1 in order not to generate the plasma 3 on the back surface side. Desirably, the electrode spacing L1 is 0.1 mm, the surface thickness T1 is 0.01 to 0.05 mm, and the thickness T2 is 2 mm, for example, in discharge in the air at an atmospheric pressure.

Figure 7:
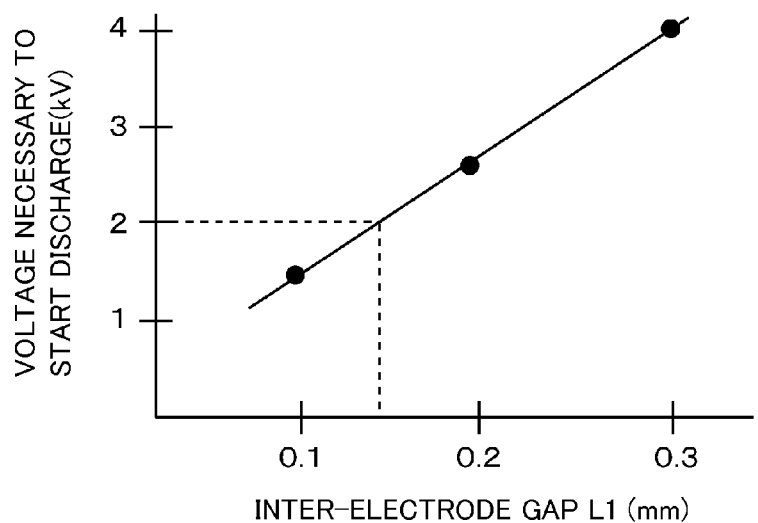
FIG. 7 is a diagram illustrative of the relationship between an inter-electrode gap in the discharge electrode and the maximum voltage of RF power necessary for discharge in the first embodiment of the present invention.

Next, the reason why the inter-electrode gap L1 between the electrodes 4-1 and 4-2 is 0.1 mm will be described. FIG. 7 illustrates the relationship between the inter-electrode gap L1 and the voltage (the wave height value) of RF power necessary for discharge in the atmosphere investigated by the inventors. The surface thickness T1 of the dielectric layer 5 is a few tens of μm. When the inter-electrode gap L1 is 0.1 mm, discharge is started at a voltage of about 1.5 kV. However, the variation of discharge is observed on the discharge surface 7 of the discharge electrode at a voltage of 1.5 kV, and a voltage of about 1.8 kV is necessary in order to stably discharge electricity on throughout the discharge surface of the discharge electrode. Namely, in order to uniformly generate plasma on the surface of the discharge electrode, it is necessary to apply a voltage about 20 to 30% higher than a voltage necessary to start discharge. When the inter-electrode gap L1 is 0.2 mm, a voltage necessary to start discharge is a voltage of about 3 kV, and a voltage of about 4 kV is necessary for discharging electricity on throughout the surface with no variation. A booster coil is provided on the booster circuit 16 in the RF power circuit 11. There are merits that a nichrome line can be used for the booster coil when the withstand voltage is a voltage of about 2 kV. Moreover, when the withstand voltage is a voltage of 4 kV or a voltage of 6 kV, which is greater than a voltage of 2 kV, for example, an extensive insulating configuration is necessary for the booster coil, causing an increase in component costs. Of course, an extensive insulating configuration is also necessary for the overall RF power circuit, and it is also necessary to increase the withstand voltage of the wire 28-3 connecting the RF power circuit 11 to the discharge electrode 2. Furthermore, such demerits also occur in that the coil size of the booster circuit 16 is scaled up when the withstand voltage is increased. In order to arrange a plurality of single modules each including the RF power circuit 11 and the discharge electrode 2 as illustrated in FIG. 1, at least two of the width E1, height E2, and length E3 of the RF power circuit 11 are necessary to be smaller than dimensions W1 and W2 of the discharge electrode 2 as illustrated in FIG. 2. In the case other than this case, it is difficult to arrange the discharge electrodes without gaps because the RF power circuits are obstacles. Generally, the booster coil is the largest component among devices for use in the RF power circuit, and it is important to make the booster coil smaller. To this end, desirably, the discharge voltage is a voltage of about 2 kV or less, and a coil of a withstand voltage of about 2 kV is used. In this case, the inter-electrode gap L1 of the discharge electrode 2 is inevitably determined as 0.1 mm.

Next, the dimensions or the like (W1×W2) of the discharge electrode 2 will be described. From the result of the experiment conducted the inventors, plasma that can be generated at a power of 1 W is about 100 mm, which is converted into the length of 1 line of plasma generated using a pair of electrodes where the inter-electrode gap L1 is 0.1 mm. A method for determining the dimensions of the discharge electrode 2 will be described based on the value. For example, as illustrated in FIG. 8, an area S of the discharge region is expressed by the following equation where the electrode length is L10, and a distance between the right end and the left end of the arrangement of the electrodes 4-1 and 4-2 is L11.

$$S = L10 \times L11 \tag{1}$$

Moreover, L11 is expressed by the following equation using the inter-electrode gap L1 and the width L2 of the electrode where the number of the inter-electrode gaps formed by the electrodes 4-1 and 4-2 is N.

$$L11 = L1 \times N + L2 \times (N+1) \tag{2}$$

A total length Lg of the inter-electrode gaps (the length of plasma when converted into discharge in one line) is expressed by the following equation.

$$Lg = L10 \times N \tag{3}$$

The following expression is necessary to be held where the output of the RF power circuit 11 is P (W).

$$Lg \leq P \times 100 \tag{4}$$

100 on the right-hand side of Expression (4) is a value based on the fact that the length of 100 mm of one line of plasma can be generated at 1 W. Here, the following equations are held where P is 20 W, L10 is 40 mm, L11 is 30 mm, and the inter-electrode gap is 0.1 mm, for example, for specific numeric values.

$$Lg = P \times 100 = 20 \times 100 = 2,000 \text{(mm)} \tag{5}$$

$$N = Lg \div L10 = 2,000 \div 40 = 50 \tag{6}$$

$$L2 = (L11 - L1 \times N) \div (N+1) = (30 - 0.1 \times 50) \div (50+1) \approx 0.5 \tag{7}$$

The width L2 of the electrode is calculated as 0.5 mm. Moreover, since W1 and W2 are slightly greater than L10 and L11, W1 is 42 mm and W2 is 32 mm, for example. It is noted that since the numbers of the electrodes 4-1 and 4-2 are equal in the cross section when N is an odd number, N may be 49 (or 51) in the calculations above. In the case where the output P of the discharge power supply is greater than 20 W, L2 can be made smaller than 0.5 mm, and in the case where the output P is smaller than 20 W, L2 is necessary to be greater than 0.5 mm.

It is noted that as already described, plasma in a length of about 100 mm can be discharged at a power of 1 W in the case of plasma discharge in one line between a pair of the antenna and the ground in the air at an atmospheric pressure (nitrogen is about 80% and oxygen is about 20%). However, plasma in a length of 500 mm, which is about five times plasma generated in the air, can be generated in an argon gas at an atmospheric pressure, and plasma in a length of 1,000 mm, which is about ten times plasma generated in the air, can be generated in a helium gas at an atmospheric pressure. Therefore, 100 in Expression (4) is replaced by 500 in the case of argon, and 100 in Expression (4) is replaced by 1,000 in the case of helium for calculation.

Moreover, also in the case where an $Si_xH_y$ gas or a $C_xH_y$ gas is used, plasma discharge in the same area at a smaller electric power is possible as compared with discharge in the air when an $Si_xH_y$ gas or a $C_xH_y$ gas is diluted by 99%, with argon or helium, for example. Therefore, the dimensions L10 and L11 can be made greater when the output power P of the RF power circuit is the same.

Furthermore, the inter-electrode gap L1 between the discharge electrodes and a voltage necessary to start discharge illustrated in FIG. 7 are changed depending on the gas composition of a gaseous phase in which plasma is generated. A voltage necessary to start discharge is a voltage of about 1.5 kV at an inter-electrode gap of 0.1 mm in the air (at an atmospheric pressure), whereas discharge can be started at a voltage of 500 V or less at an inter-electrode gap of 0.1 mm in an argon or helium atmosphere (at an atmospheric pressure). Therefore, the inter-electrode gap L1 can be increased up to about 1 mm when using an RF power circuit of a withstand voltage of 2 kV.

Next, an exemplary apparatus configuration is illustrated as an example of the plasma processing apparatus in the case where the embodiment is applied to a plasma cleaning apparatus. FIG. 9 illustrates an exemplary plasma cleaning apparatus. In a processing apparatus 31, a plurality of the plasma modules 1 are provided in a processing chamber 34. A body (a substrate) 6 to be processed is carried in the processing chamber 34 by a roller 32. The processing chamber 34 is connected to an exhaust system 38 that exhausts a gas or air. Moreover, a gas switching unit 33 is provided at a loading port or a conveying port for the body 6 to be processed for separating the outside air from the atmosphere in the processing chamber 34. In order to apply the plasma 3 generated in the plasma module 1 to the body 6 to be processed, a distance between the discharge surface of the plasma module 1 and the processed surface of the body 6 to be processed may be about 0.1 to 10 mm.

For specific apparatuses in a configuration equivalent to the configuration of the apparatus according to the embodiment, the following is named: a plasma cleaning apparatus that removes organic substances attached on a glass substrate, which is a body to be processed; a plasma sterilization and cleaning apparatus that cleans and sterilizes finger marks attached on a handrail (a railing), which is a body to be processed; and a plasma surface modification apparatus that applies plasma to a resin or a metal, for example, which is a body to be processed, for bonding as pre-processing. When the plasma cleaning apparatus is used to clean the surfaces of liquid crystal glass substrates in different sizes, the suppression of fluctuations of the plasma density between discharge electrodes and fluctuations of electron temperature is enabled in substrates in any sizes, and the improvement of uniformity is enabled. Moreover, the number of the plasma modules is adjusted according to the size of a substrate to obtain an excellent result also on the point of power costs.

It is noted that in the description above, as illustrated in FIG. 1, such a configuration is formed in which the circuit that determines a frequency is provided on the control unit side in the plasma module. The merits are the fact that faulty discharge caused by a potential difference between the discharge electrodes can be suppressed because the phase of RF power is the same between the plasma modules. Moreover, there are also merits that the characteristics of plasma to be generated are made equal because the frequency is the same between the plasma modules.

On the other hand, such configurations can be considered that processing characteristics are not affected much depending on processes even though a certain spacing is provided between the plasma modules or there are fluctuations more or less in the characteristics of plasma between the modules.

Figure 20:
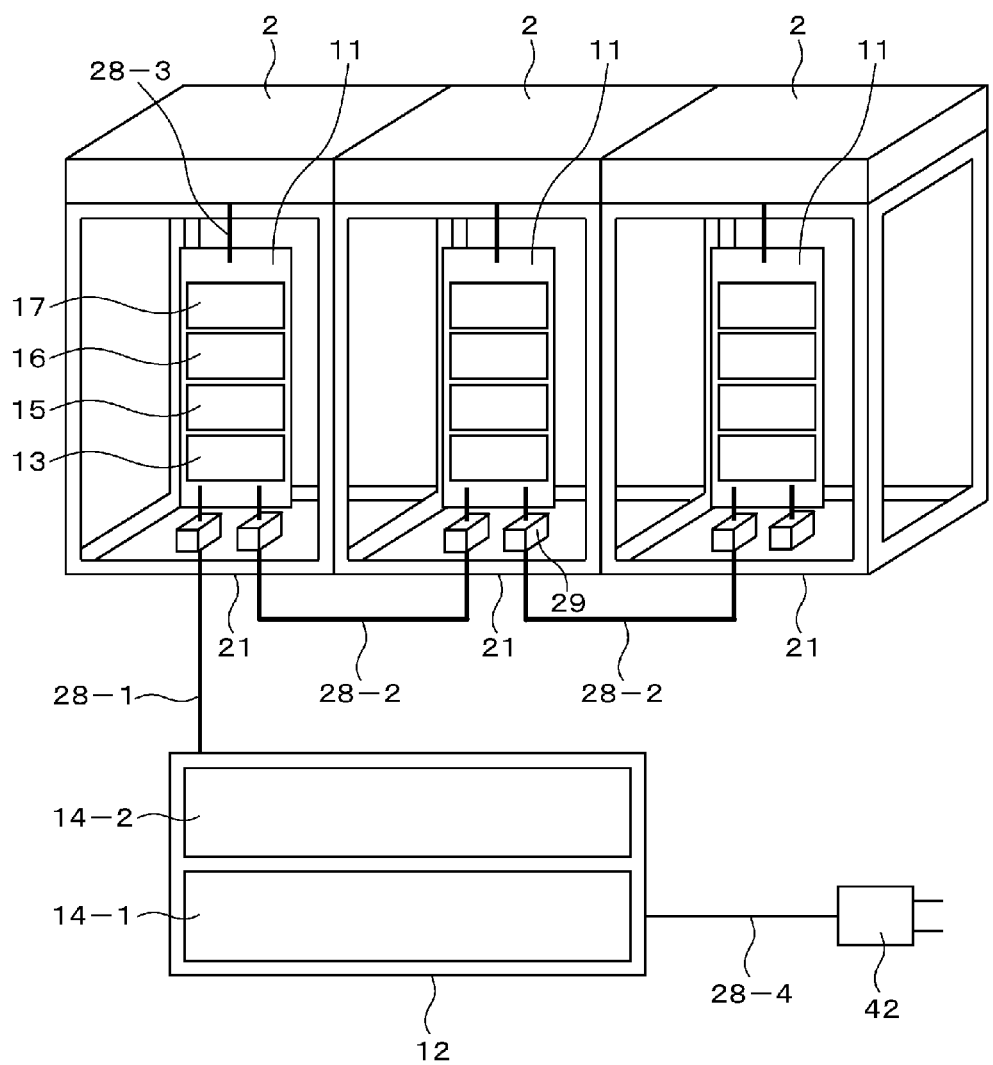
FIG. 20 is a schematic block diagram of another main part of the plasma processing apparatus according to the first embodiment of the present invention.

In this case, the circuit that determines a frequency is not necessarily provided on the control unit 12, and the circuit may be provided on the RF power circuit side including the booster circuit. This example is illustrated in FIG. 20. The description of the configurations the same in FIG. 1 is omitted. In the configuration in FIG. 20, the RF power circuits 11 each include the RF signal circuit 13, the low-voltage RF power circuit 15, the booster circuit 16, and the matching circuit 17. The control unit 12 is provided with two DC power supplies 14-1 and 14-2. One of the DC power supplies 14-1 and 14-2 is used for power for the RF signal circuit 13, and the other is used for the main power supply of RF power.

Moreover, for example, when using a self-excited inverter power supply in the basic configuration of a switching circuit and a booster coil, the switching circuit also serves as the RF signal circuit and the low-voltage RF power circuit, so that the RF power circuits 11 are configured to include the switching circuit, the booster circuit, and the matching circuit. It is noted that also in the case where the configuration in FIG. 20 is formed, the distance between the discharge electrode 2 and the RF power circuit 11 is made equal between the modules, so that plasma density can be made equal between the modules.

As described above, according to the embodiment, the discharge electrode and the RF power circuit are formed in a single plasma module, so that it is possible to provide a plasma processing apparatus that can generate uniform plasma without increasing power costs per unit electric power even in the case where the discharge area is increased to adapt to samples in given sizes by arranging a plurality of plasma discharge units.

Second Embodiment

Next, a second embodiment of the present invention will be described with reference to FIGS. 10 to 16. It is noted that points described in the first embodiment but not described in the second embodiment are also applicable to the second embodiment unless otherwise specified.

FIG. 10 is a schematic block diagram of an overall plasma processing apparatus (a plasma film deposition apparatus) according to the embodiment. The plasma film deposition apparatus is a film deposition apparatus according to a method in which a substrate (a body) 6 to be processed is provided directly above a discharge electrode 2 and plasma 3 is generated above the substrate 6 to be processed for film deposition. This processing apparatus 31 is provided with a case (a processing chamber) 34 that forms a processing chamber, a plasma module 1, and a roller 32 that carries the body 6 to be processed. Moreover, a gas atmosphere switching unit 33 that switches a gas atmosphere between the inside of the processing chamber and the outside of the processing chamber is provided at the conveying port of the body 6 to be processed. Furthermore, in order to supply a processing gas into the processing chamber, the processing gas supplied from a processing gas supply source 37 can be supplied into the processing chamber 34 through a gas pipe 36 and a gas supply port 35. A porous body may be used for the gas supply port 35, for example, in order to uniformly supply a processing gas from a gas supply port surface. It is noted that in the case of the apparatus configuration illustrated in FIG. 10, it is necessary to determine the spacing of the electrode, the width of the electrode, or the like in the discharge electrode 2 in consideration of the material and thickness of the substrate in order to generate plasma above the substrate to be processed.

Figure 11A:
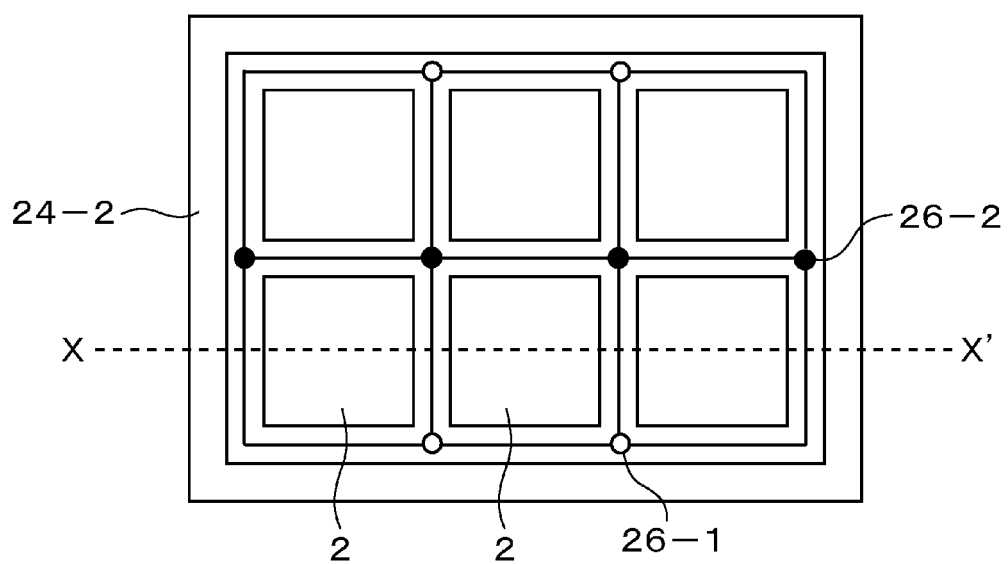
FIG. 11A is a top view illustrative of a plasma module array of the plasma processing apparatus (the plasma film deposition apparatus) according to the second embodiment of the present invention.
Figure 11B:
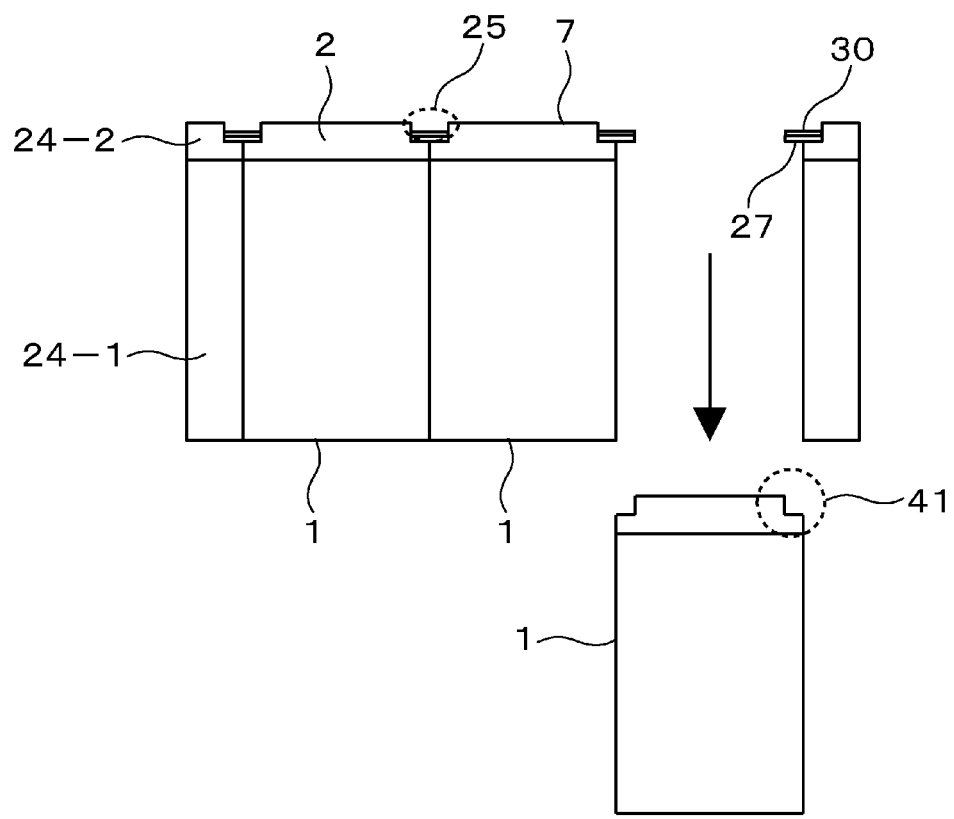
FIG. 11B is a diagram illustrative of a plasma module array of the plasma processing apparatus (the plasma film deposition apparatus) according to the second embodiment of the present invention, showing an X-X' cross sectional view of FIG. 11A.

FIGS. 11A and 11B illustrate a plasma module array. FIG. 11A is a top view, and FIG. 11B is a cross sectional view along a line X-X' in FIG. 11A. In FIG. 11B, the plasma module 1 is mounted on an outer frame 24-1, and one plasma module (a module on the lower side) is removed. An upper part 24-2 of the outer frame 24-1 is provided on the same height as a discharge surface 7 of the discharge electrode 2. Moreover, the outer circumferential portion of the discharge electrode 2 is provided with a step 41 for forming a gas passage (a groove) 25. Furthermore, a gasket 27 is pressed against the step 41 of the discharge electrode 2 using a retainer 30. In addition, on a groove 25 that is a gas passage, a gas hole 26-1 that supplies a gas and a gas hole 26-2 that takes in a gas are provided in places. From the gas supply port 26-1, a discharge suppressing gas such as a nitrogen gas, which does not tend to discharge electricity as compared with a noble gas, is supplied, for example. Moreover, the supplied discharge suppressing gas is exhausted from the gas outlet port 26-2, and a slight negative pressure is applied across the body to be processed and the discharge electrode, so that the body to be processed is brought into intimate contact with the discharge surface 7 of the discharge electrode 2 as much as possible. It is noted that the gas holes 26-1 and 26-2 or the gas passage 25 may be similarly provided on the plasma module array of the surface processing apparatus (the plasma cleaning apparatus) according to the first embodiment.

Figure 12:
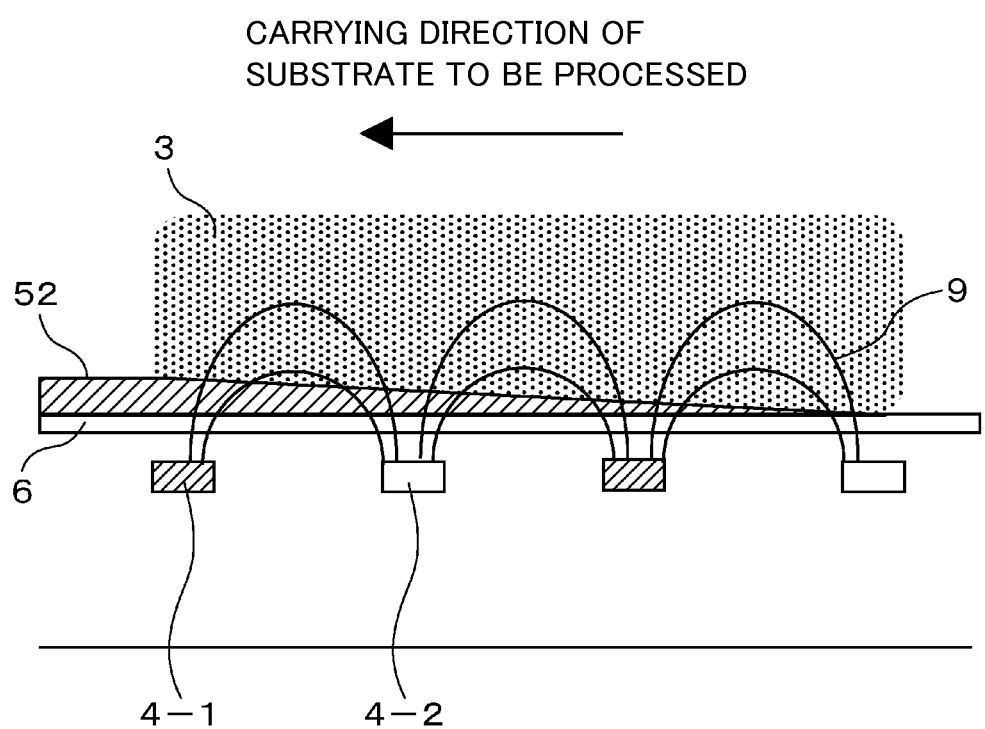
FIG. 12 is a diagram of the outline of a film deposition process of the plasma processing apparatus (the plasma film deposition apparatus) according to the second embodiment of the present invention.

FIG. 12 illustrates the manner of a plasma film deposition process, showing the manner of film deposition in which a functional film 52 is deposited in the plasma 3 while carrying the body (the substrate) 6 to be processed from the right to the left direction in FIG. 12. FIG. 13 illustrates an example in the case where a film is deposited along the electrode pattern of the discharge electrode 2. As illustrated in FIG. 13, such a configuration is formed in which two spacings are provided between electrodes 4-1 and 4-2, a spacing L1 between the electrodes 4-1 and 4-2 for discharging electricity to generate the plasma 3 and a spacing L3 between the electrodes 4-1 and 4-2 for not discharging electricity. In this case, when the substrate 6 to be processed is placed stationarily on the discharge electrode 2 and a film is deposited on the substrate 6 to be processed, the film can be selectively deposited along the discharge region.

Figure 14A:
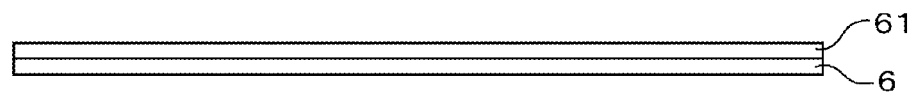
FIGS. 14A to 14G are diagrams of an exemplary flow of the film deposition process of the plasma processing apparatus (the plasma film deposition apparatus) according to the second embodiment of the present invention.
Figure 14B:
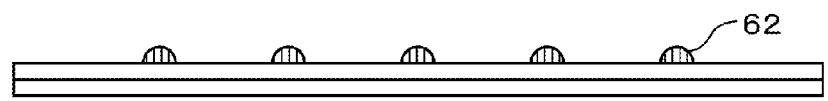
Figure 14C:
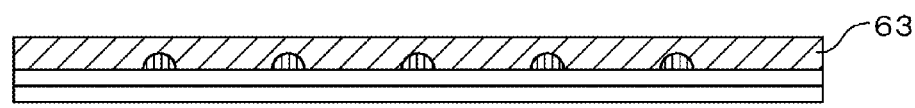
Figure 14D:
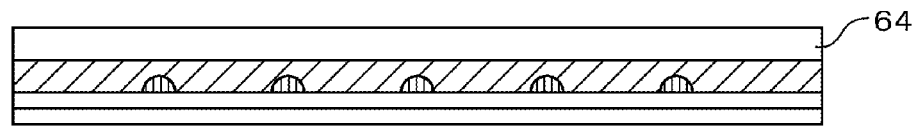
Figure 14E:
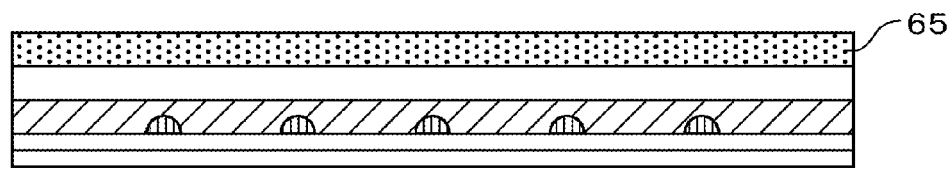
Figure 14F:
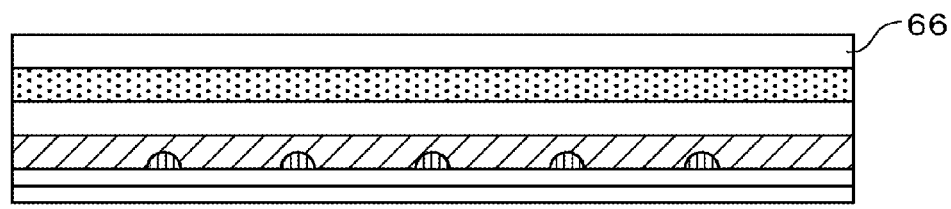
Figure 14G:
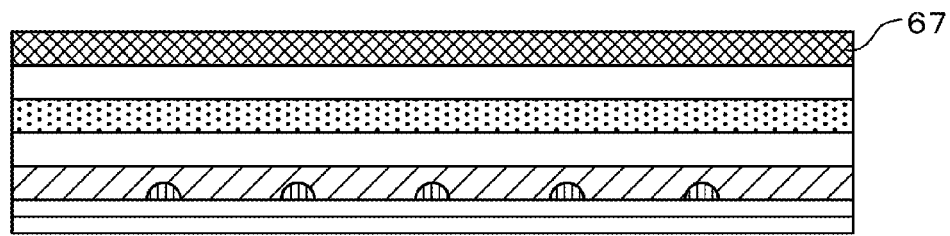

FIGS. 14A to 14G are diagrams of an exemplary flow of the film deposition process in the plasma processing apparatus (the plasma film deposition apparatus) according to the embodiment; the manufacturing process steps of a solar cell are taken as an exemplary manufacture of a device. For example, a transparent resin film is used for the body (the substrate) 6 to be processed. First, an SiN film 61 is formed as a gas barrier layer on the substrate 6, for example (FIG. 14A). In the forming, a gas that a mixed gas made of $SiH_4$, $H_2$, and $NH_3$ is diluted with He is used for a processing gas, for example. Subsequently, a conductive electrode 62 is deposited in a film deposition apparatus provided with the discharge electrode as shown in FIG. 13 (FIG. 14B). Subsequently, for depositing an n-type Si layer 63, a mixed gas made of $SiH_4$, $H_2$, $PH_3$, and the like diluted with He is used (FIG. 14C). Subsequently, for depositing an i-type Si layer 64, a mixed gas made of $SiH_4$, $H_2$, and the like diluted with He is used for film deposition (FIG. 14D). Subsequently, for depositing a p-type Si layer 65, a mixed gas made of $SiH_4$, $H_2$, $B_2H_6$, and the like diluted with He is used for film deposition (FIG. 14E). Subsequently, a conductive film 66 is formed as a back side electrode (FIG. 14F), and finally, a barrier film 67 is formed (FIG. 14G). Excellent results have been obtained from the solar cell thus formed on the points of the uniformity of repeated electrode patterns and power costs. Moreover, since the plasma modules can be easily and freely combined, the discharge electrodes can be scaled up and scaled down easily at low costs depending on the size of the body to be processed.

It is noted that such a method may be possible in which a plurality of the electrodes 62 are not electrically connected to each other in course of the film deposition process and the electrodes 62 are connected to each other in the last steps of the film deposition process.

Figure 15:
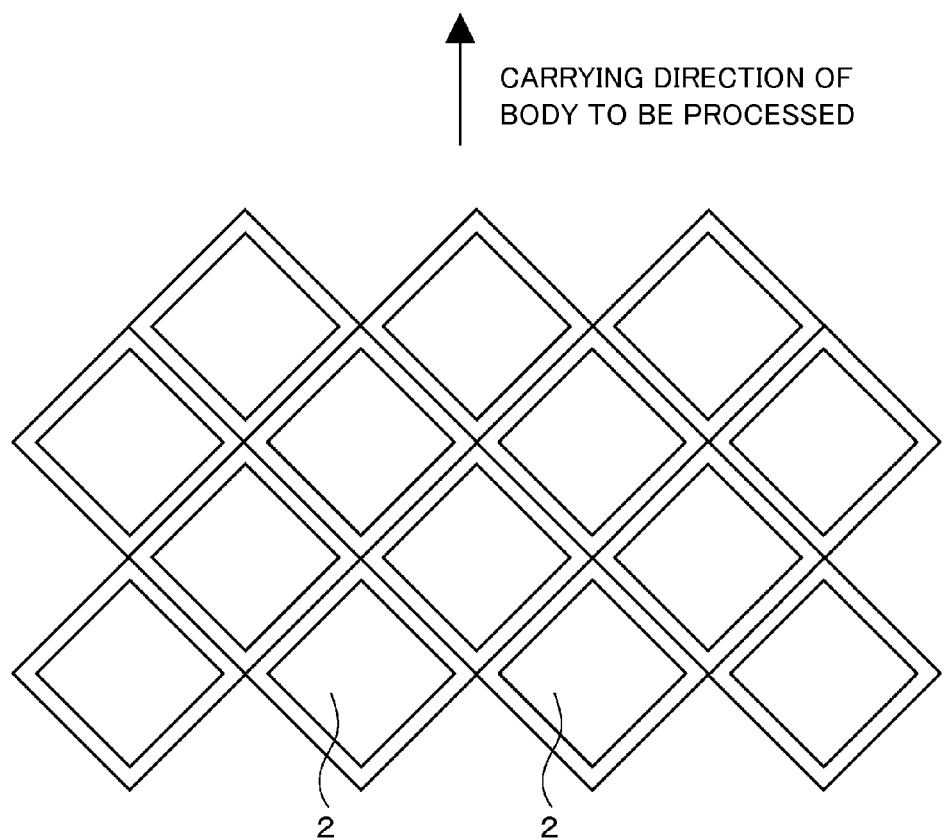
FIG. 15 is a diagram of another arrangement of the plasma module array of the plasma processing apparatus (the plasma film deposition apparatus) according to the second embodiment of the present invention.
Figure 16:
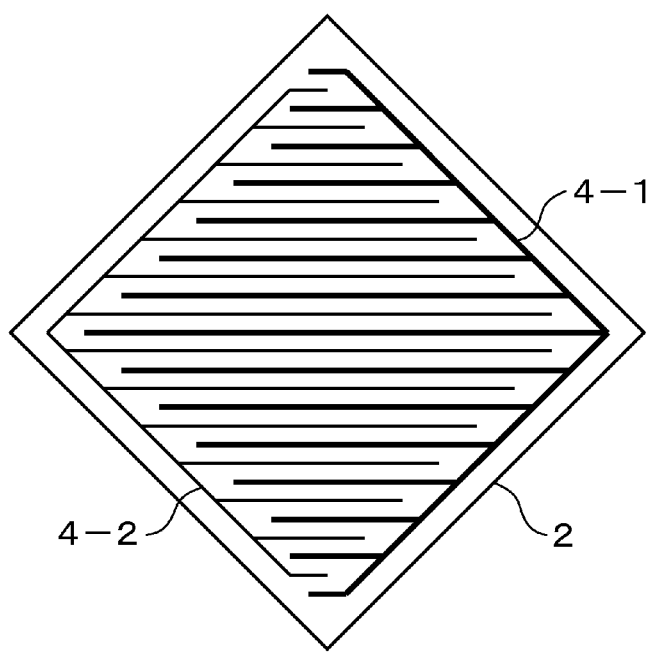
FIG. 16 is a diagram of another electrode structure of the discharge electrode of the plasma processing apparatus (the plasma film deposition apparatus) according to the second embodiment of the present invention.

Furthermore, for the arrangement of the discharge electrodes in the plasma processing apparatus, the arrangement illustrated in FIG. 15 may be possible. In addition, the electrode pattern of the discharge electrode may be a pattern illustrated in FIG. 16.

As described above, according to the embodiment, it is possible to provide a plasma processing apparatus that can generate uniform plasma without increasing costs per unit electric power even in the case where the discharge area is increased to adapt to samples in given sizes by arranging a plurality of plasma discharge units. Moreover, it is possible to highly uniformly form a desired repeated pattern on the substrate to be processed by changing the electrode spacing. Furthermore, it is possible to uniformly supply a desired gas on the substrate to be processed by the configuration in which the substrate to be processed is disposed on the discharge electrode.

Third Embodiment

A third embodiment of the present invention will be described with reference to FIG. 17 to FIGS. 19A and 19B. It is noted that points described in the first or second embodiment but not described in the third embodiment are also applicable to the third embodiment unless otherwise specified.

Figure 17:
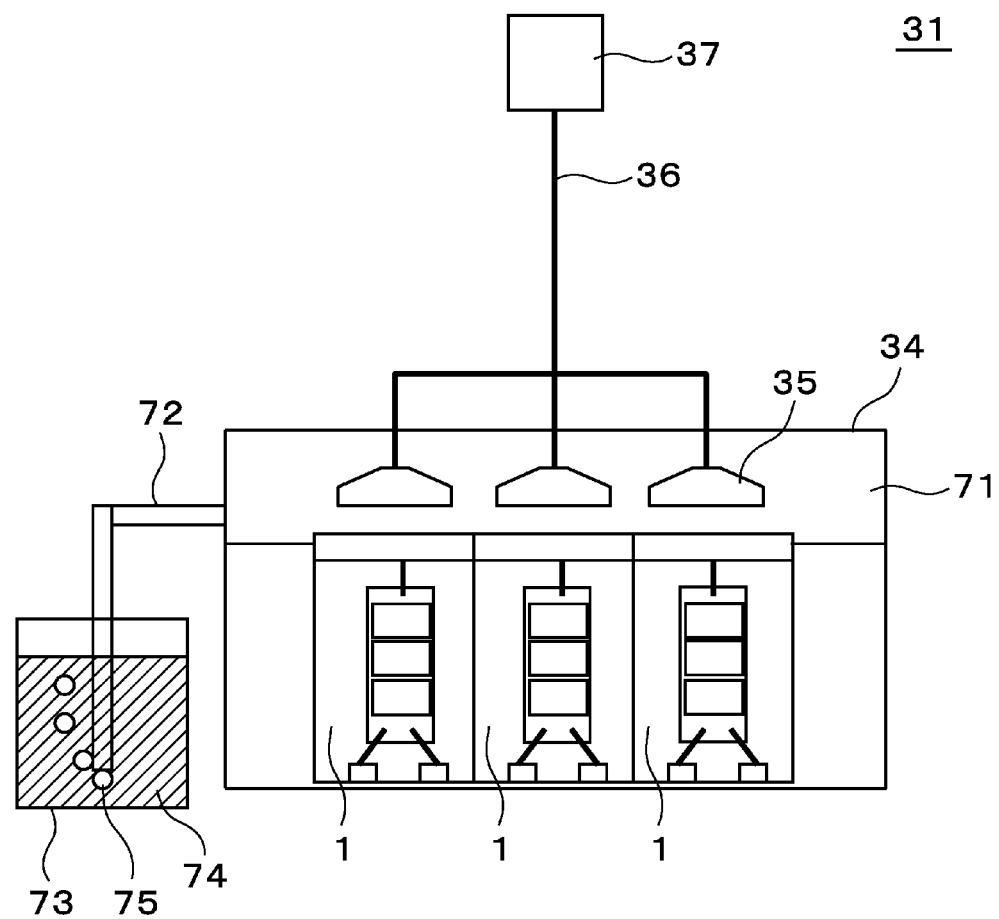
FIG. 17 is a schematic block diagram of an overall plasma processing apparatus (an ozone processing apparatus) according to a third embodiment of the present invention.
Figure 18A:
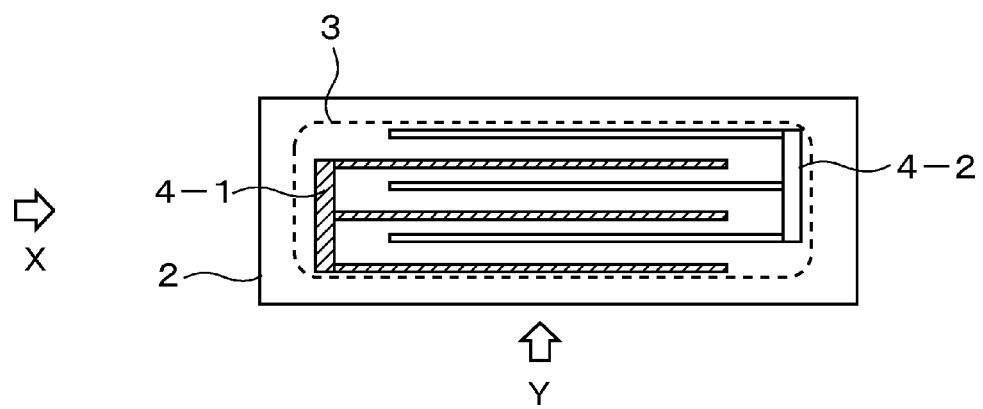
FIG. 18A is a top view of the schematic configuration of a gas supply unit of the plasma processing apparatus (the ozone processing apparatus) according to the third embodiment of the present invention.
Figure 18B:
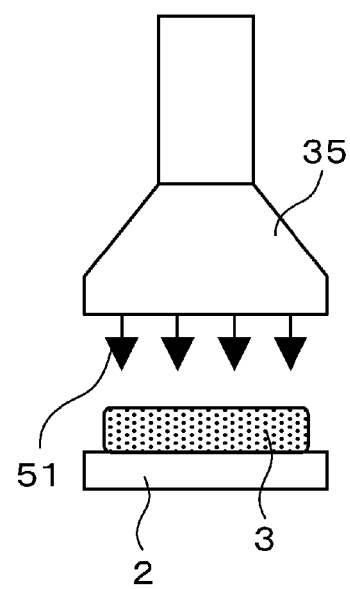
FIG. 18B is a schematic block diagram of the gas supply unit of the plasma processing apparatus (the ozone processing apparatus) according to the third embodiment of the present invention; showing a side view seen from an X-direction of FIG. 18A.
Figure 18C:
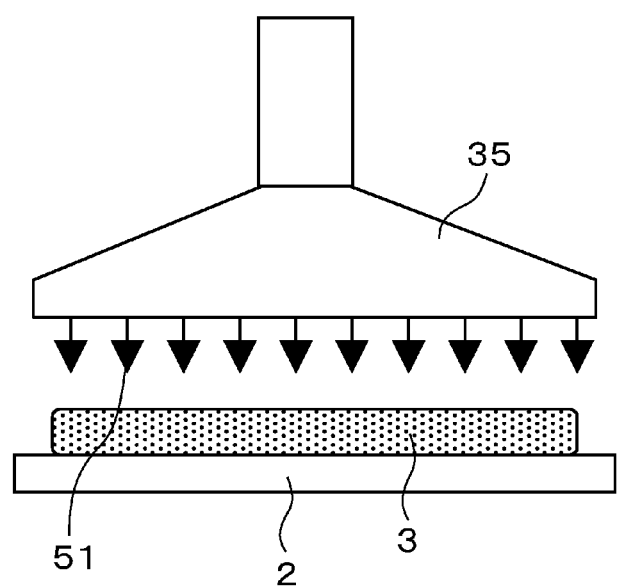
FIG. 18C is a schematic block diagram of the gas supply unit of the plasma processing apparatus (the ozone processing apparatus) according to the third embodiment of the present invention, showing a side view seen from a Y-direction of FIG. 18A.
Figure 19A:
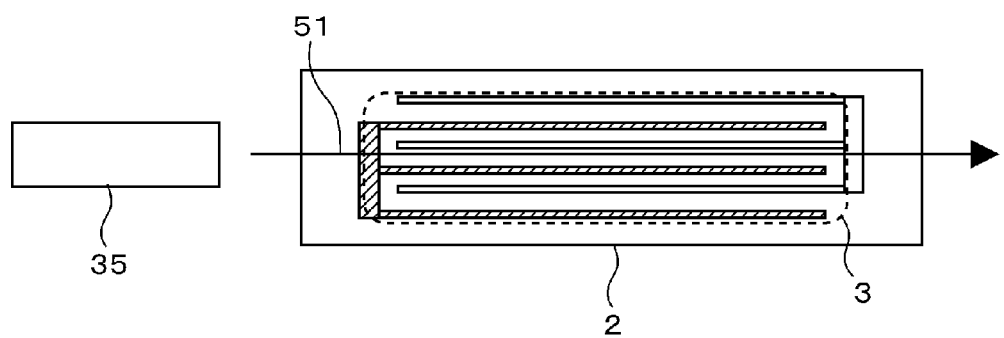
FIG. 19A is a diagram illustrative of a method for blowing a gas to a discharge electrode of the plasma processing apparatus (the ozone processing apparatus) according to the third embodiment of the present invention, showing a desirable case.
Figure 19B:
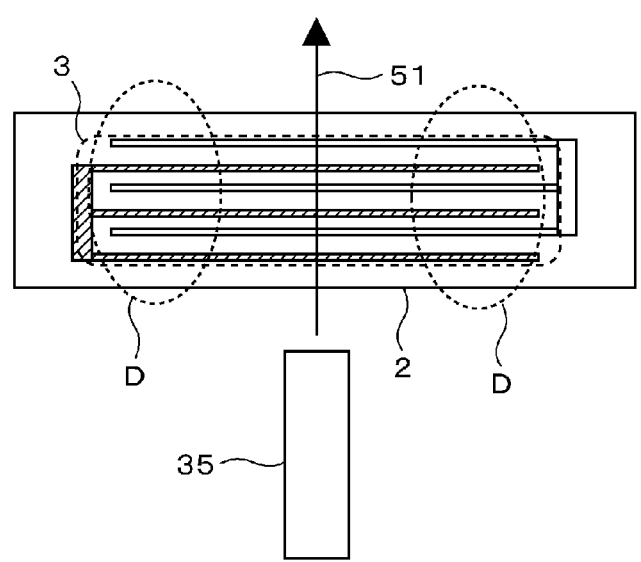
FIG. 19B is a diagram illustrative of a method for blowing gas to the discharge electrode of the plasma processing apparatus (the ozone processing apparatus) according to the third embodiment of the present invention, showing an undesirable case.

FIG. 17 is a schematic block diagram of an overall ozone processing apparatus that is one of plasma processing apparatuses. FIGS. 18A to 18C are schematic block diagrams of a gas supply unit and a plasma discharge unit of the ozone processing apparatus. FIG. 18A is a top view, FIG. 18B is a side view seen from the X-direction in FIG. 18A, and FIG. 18C is a side view see from the Y-direction in FIG. 18A. FIGS. 19A and 19B are diagrams illustrative of simple examples of a gas blow method. FIG. 19A is an example of a desirable case, and FIG. 19B is an example of an undesirable case. In a plasma processing apparatus (an ozone processing apparatus) 31, a plurality of plasma modules 1 are provided in a case 34 as illustrated in FIG. 17. Air, an oxygen gas, or the like is used for a gas for generating ozone, and the gas is supplied from a gas supply system 37 to an ozone generating space 71 through a gas line (pipe) 36 and a gas supply port 35. The ozone generated in the ozone generating space 71 is supplied to water 74 in a pipe 73, which is a body to be processed, through an ozone supply pipe 72, for example. The body to be processed may be pond water or pool water. A reference numeral 75 is a gas containing ozone.

As illustrated in FIG. 18A, the plasma discharge unit generates plasma 3 in a rectangle region when seen from above. The shape of a discharge port (a gas supply port) 35 is a rectangular nozzle the same as the shape of the discharge region of the plasma 3, and a processing gas is supplied from directly above to the entire plasma discharge region. Since the reaction decomposition of ozone is developed when gas temperature is at high temperature, desirably, a scheme may be provided for keeping gas temperature at low temperature. Since gas temperature greatly depends on the surface temperature of the discharge electrode 2, it is important to cool the surface of the discharge electrode 2 in order to reduce gas temperature. This is an effective cooling method that cooling water is run on the back surface side of the discharge electrode 2, for example. On the other hand, in the case where the back surface side of the discharge electrode 2 is cooled, the front surface side of the discharge electrode 2 is not always cooled sufficiently. As illustrated in FIGS. 18B and 18C, desirably, a gas 51 can be supplied to the surface of the discharge electrode 2, and the discharge electrode 2 is directly cooled by delivering a jet blast of the processing gas as powerfully as possible. It is noted that for example, as illustrated in FIGS. 19A and 19B, in the case where the processing gas is blown to the surface of the discharge electrode 2 as the tip end (the gas supply port 35) of the gas pipe is directed to the plasma discharge region, desirably, the gas is blown to the longitudinal direction of the plasma 3 for cooling the entire discharge region as illustrated in FIG. 19A. In the case of FIG. 19B where the gas is vertically blown to the longitudinal direction, only the blown region and the portions around the blown region are cooled, and regions D around the blown region are not cooled so much. Moreover, it is difficult to increase the amount of ozone generated because the dwell time of the gas in plasma is short or it is difficult to increase the amount of the gas passing through plasma, for example. It goes without saying that any configurations may be possible, not limited to the configuration in FIG. 19A, as long as configurations can deliver a powerful jet blast of a processing gas to the entire discharge region on the surface of the discharge electrode for the purpose of cooling the surface of the discharge electrode using the processing gas.

The foregoing ozone processing apparatus has been used, and the number of the plasma modules has been changed depending on the pipe size or the water amount for treating water in a pool. Consequently, excellent results have been obtained on the uniformity and electric power costs of the individual plasma modules.

It is noted that the present invention is not limited to the foregoing embodiments, and the present invention includes various exemplary modifications and alterations. For example, the forgoing embodiments are described in detail for easy understanding of the present invention, and the present invention should not be limited to embodiments having all the configurations described above. Moreover, a part of the configuration of one embodiment can be replaced by the configuration of another embodiment, and the configuration of one embodiment can be added with the configuration of another embodiment. Furthermore, a part of the configurations of the embodiments can be added with, removed from, and replaced by another configuration.

What is claimed is:
1. A plasma processing apparatus comprising:
a case;
a discharge electrode provided in the case; and
an RF power supply configured to generate plasma, wherein the RF power supply includes:
an RF signal circuit configured to determine a frequency;
a low-voltage RF power circuit electrically connected to the RF signal circuit and configured to generate low-voltage RF power; and
a booster circuit electrically connected to the low-voltage RF power circuit and configured to generate high-voltage RF power,
wherein an RF power circuit includes at least the low-voltage RF power circuit and the booster circuit, each being disposed in the case in which the discharge electrode is provided, and configures a plasma module,
a plurality of plasma modules are connected in parallel with each other, the plasma modules being individually configured of the discharge electrode, the RF power circuit, and the case, the RF signal circuit is disposed independently from the plurality of the plasma modules, and a frequency signal from the RF signal circuit is inputted to only one of the plurality of the plasma modules, and transmitted between the plurality of plasma modules in parallel via one or more pairs of connectors, each pair of connectors being disposed within the case and connecting adjacent plasma modules.

2. The plasma processing apparatus according to claim 1, wherein the discharge electrode has a configuration in which two types of lead wires are provided in a dielectric layer; and a spacing between the two types of the lead wires is 0.1 mm, and plasma is generated in an atmosphere at RF power at a peak voltage of 2 kV or less.

3. The plasma processing apparatus according to claim 1, wherein the discharge electrode has a configuration in which two types of lead wires are provided in a dielectric layer; and a spacing between the two types of the lead wires is 0.1 mm or more and 1 mm or less, and plasma is generated at an atmospheric pressure at RF power at a peak voltage of 2 kV or less using a noble gas or a processing gas containing a noble gas as a principal component.

4. A plasma processing apparatus comprising:
a plurality of plasma modules disposed adjacent to each other; and
a control unit electrically connected to only one of the plurality of plasma modules,
wherein the plasma modules individually include:
a discharge electrode; and
an RF power circuit electrically connected to the discharge electrode and configured to generate plasma; and
the discharge electrodes of the plasma modules are connected to the RF power circuits of the plasma modules using wires adjusted to have an equal length,
wherein the plasma modules are connected to one another via one or more pairs of connectors, each pair of connectors connecting adjacent plasma modules.

5. The plasma processing apparatus according to claim 4, wherein the control unit includes an RF signal circuit configured to determine a frequency; and
the RF power circuit includes:
a low-voltage RF power circuit configured to generate low-voltage RF power by a signal from the RF signal circuit; and
a booster circuit configured to generate high-voltage RF power by the low-voltage RF power from the low-voltage RF power circuit.

6. The plasma processing apparatus according to claim 4, wherein the RF power circuit includes:
an RF signal circuit configured to determine a frequency;
a low-voltage RF power circuit configured to generate low-voltage RF power by a signal from the RF signal circuit; and
a booster circuit configured to generate high-voltage RF power by the low-voltage RF power from the low-voltage RF power circuit.

7. The plasma processing apparatus according to claim 4, wherein the number of the plasma modules is determined according to a size of a object to be processed.

8. The plasma processing apparatus according to claim 4, wherein the plasma is generated between the discharge electrode and an object to be processed.

9. The plasma processing apparatus according to claim 4, wherein an object to be processed is disposed on the discharge electrode.

10. The plasma processing apparatus according to claim 4, wherein the discharge electrode is provided with a step on an outer circumferential edge, and a gas passage is formed between adjacent discharge electrodes.

11. The plasma processing apparatus according to claim 10, wherein the gas passage is provided with a gas supply port and a gas outlet port.

12. The plasma processing apparatus according to claim 4, wherein the discharge electrode includes a portion of a narrow spacing where electricity tends to be discharged and a portion of a wide spacing where electricity does not tend to be discharged.

13. The plasma processing apparatus according to claim 4, wherein a processing gas for generating the plasma is supplied to the discharge electrode in a vertical direction.

14. A plasma processing apparatus comprising:
a plurality of plasma modules disposed adjacent to each other and connected in parallel with each other; and
a control unit electrically connected to only one of the plurality of plasma modules,
wherein the plasma modules individually include:
a case;
a discharge electrode mounted on the upper part of the case; and
an RF power circuit disposed in the case and electrically connected to the discharge electrode, and configured to generate plasma by RF power,
wherein an upper part of each of the plurality of cases is provided at a same height as a discharge surface of the plural discharge electrodes,
wherein each of the discharge electrodes has a configuration in which two types of lead wires are provided in a dielectric layer, each of the discharge electrodes is a surface discharge type electrode to generate the plasma on the discharge surface,
wherein each of the RF power circuits includes a low-voltage RF power circuit and a booster circuit,
wherein each low-voltage RF power circuit is electrically connected to a RF signal circuit and is configured to generate low-voltage RF power,
wherein each booster circuit is electrically connected to one of the low-voltage RF power circuits and is configured to generate high-voltage RF power,
wherein the RF signal circuit is disposed independently from the plurality of the plasma modules, and
wherein a frequency signal from the RF signal circuit is inputted to only one of the plurality of the plasma modules, and transmitted between the plurality of plasma modules in parallel via one or more pairs of connectors, each pair of connectors being disposed within the case and connecting adjacent plasma modules, whereby each phase of the RF power is controlled the same between the plurality of plasma modules.

* * * * *

UNITED STATES PATENT AND TRADEMARK OFFICE
CERTIFICATE OF CORRECTION

PATENT NO. : 9,293,300 B2
APPLICATION NO. : 13/654572
DATED : March 22, 2016
INVENTOR(S) : Hiroyuki Kobayashi et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 568 days.

Signed and Sealed this
Fifth Day of July, 2016

Michelle K. Lee
*Director of the United States Patent and Trademark Office*